US 6,649,535 B1

(12) United States Patent
Yu et al.

(10) Patent No.: US 6,649,535 B1
(45) Date of Patent: Nov. 18, 2003

(54) METHOD FOR ULTRA-THIN GATE OXIDE GROWTH

(75) Inventors: Mo-Chiun Yu, Taipei (TW); Shih-Chang Chen, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/074,928

(22) Filed: Feb. 12, 2002

(51) Int. Cl.$^7$ .................. H01L 21/31; H01L 21/469
(52) U.S. Cl. .................. 438/763; 438/770; 438/777; 438/784
(58) Field of Search ............. 438/784–792, 438/424, 426, 435, 911, 706, 738, 763, 773, 770, 777

(56) References Cited

U.S. PATENT DOCUMENTS

| | | | | |
|---|---|---|---|---|
| 4,149,905 A | * | 4/1979 | Levinstein et al. | 438/477 |
| 4,498,953 A | * | 2/1985 | Cook et al. | 438/738 |
| 4,749,440 A | * | 6/1988 | Blackwood et al. | 438/706 |
| 4,938,815 A | * | 7/1990 | McNeilly | 118/726 |
| 5,599,438 A | * | 2/1997 | Shiramizu et al. | 205/746 |
| 5,635,053 A | * | 6/1997 | Aoki et al. | 205/746 |
| 5,676,760 A | * | 10/1997 | Aoki et al. | 134/1.3 |
| 6,037,238 A | * | 3/2000 | Chang et al. | 438/426 |
| 6,039,055 A | * | 3/2000 | Akatsu | 134/1.3 |
| 6,039,815 A | * | 3/2000 | Yeol et al. | 134/2 |
| 6,082,373 A | * | 7/2000 | Sakurai et al. | 134/1 |
| 6,087,243 A | | 7/2000 | Wang | 438/424 |
| 6,124,211 A | * | 9/2000 | Butterbaugh et al. | 438/708 |
| 6,171,911 B1 | | 1/2001 | Yu | 438/275 |
| 6,204,205 B1 | | 3/2001 | Yu et al. | 438/787 |
| 6,255,231 B1 | | 7/2001 | Chen et al. | 438/773 |
| 6,258,730 B1 | | 7/2001 | Sun et al. | 438/763 |
| 6,290,777 B1 | * | 9/2001 | Imaoka et al. | 134/1 |

* cited by examiner

Primary Examiner—Michael S. Lebentritt
(74) Attorney, Agent, or Firm—George O. Saile; Stephen B. Ackerman

(57) ABSTRACT

A method for forming an ultra-thin (between about 15 to 20 Angstroms), silicon dioxide gate insulator layer, featuring a process sequence which widens the process window of the thermal oxidation procedure, and improves the quality of the ultra-thin silicon dioxide gate insulator layer, has been developed. After a series of wet clean procedures applied to a semiconductor substrate, a high temperature anneal procedure is performed in an inert ambient. The high temperature anneal removes organic, as well as inorganic material not removed during the wet clean procedures, and also removes native oxide formed during these same wet clean procedures. The removal of these materials allow the use of longer thermal oxidation times still resulting in silicon dioxide thickness equal to counterparts formed using shorter oxidation times, which were not subjected to the pre-oxidation high temperature anneal procedure. In addition to the widening of the process window, or the use of extended oxidation times, allowed the use of higher oxidation temperatures, resulting in silicon dioxide gate insulator layers exhibiting higher dielectric quality than counterparts formed using lower oxidation temperatures.

20 Claims, 2 Drawing Sheets

METHOD FOR ULTRA-THIN GATE OXIDE GROWTH

BACKGROUND OF THE INVENTION

(1) Field of the Invention

The present invention relates to methods used to fabricate semiconductor devices, and more specifically to a method used to prepare a semiconductor surface for growth of a thin silicon dioxide gate insulator layer.

(2) Description of Prior Art

The trend to micro-miniaturization, or the ability to fabricate semiconductor devices featuring sub-micron features, for purposes of improving device performance as well as for decreasing processing costs, have led to the use of ultra-thin gate insulator layers. Silicon dioxide layers as thin as 15 Angstroms, have been used for the gate insulator layer for metal oxide semiconductor field effect transistor (MOSFET) devices. However the process window in terms of oxidation temperature and time, can be limited for the thermal oxidation processes employed to grow the ultra-thin gate insulator layer. To improve quality of the thin silicon dioxide gate insulator layers higher oxidation temperatures are required, however at the expense of decreasing oxidation time to values difficult to control.

This invention will describe a pre-oxidation procedure which will expand the process window for subsequent attainment of thermally grown, ultra-thin silicon dioxide layers, specifically allowing longer oxidation times to be used with higher oxidation temperatures. The use of longer oxidation times increase the process window or control, while the higher oxidation temperature improves the quality of the ultra-thin silicon dioxide layer. This is made possible via implementation of a novel, pre-oxidation anneal treatment, performed at high temperatures, resulting in a cleaner semiconductor surface thus the attainment of a higher quality silicon dioxide layer. In addition the higher temperature pre-oxidation anneal procedure more effectively removes native oxide from the semiconductor surface, where in previous cases the native oxide contributed to the final silicon dioxide thickness thus resulting in shorter oxidation time required to obtain a specific silicon dioxide thickness. The longer oxidation times allow greater process control to be realized. Prior art such as: Yu, in U.S. Pat. No. 6,171,911; Sun et al, in U.S. Pat. No. 6,258,730B1; Wang, in U.S. Pat. No. 6,087,243; Chen et al, in U.S. Pat. No. 6,255,2311B1; and Yu et al, in U.S. Pat. No. 6,204,205B1; describe procedures for pre-treating semiconductor substrates prior to oxidation, procedures for specific oxidation conditions, and procedures for post oxidation anneal treatments. However none of these prior arts describe the novel process sequence used in this present application wherein a high temperature anneal is performed prior to the thermal oxidation procedure used to grow ultra-thin silicon dioxide gate insulator layers, allowing the process window for the oxidation procedure to be increased.

SUMMARY OF THE INVENTION

It is an object of this invention to thermally grow an ultra-thin (less than 20 Angstrom), silicon dioxide gate insulator layer, for a MOSFET device.

It is another object of this invention to increase the process window of the thermal oxidation procedure, and to improve gate insulator layer quality, via extending oxidation time and via use of higher oxidation temperatures.

It is still another object of this invention to perform a high temperature anneal procedure in an inert ambient after a series of wet clean procedures and prior to growth of the silicon dioxide gate insulator layer, to extend oxidation time and to improve the quality of the thermally grown silicon dioxide layer.

In accordance with the present invention a method of forming an ultra-thin silicon dioxide gate insulator layer featuring a high temperature anneal procedure, performed in an inert ambient prior to a high temperature thermal oxidation procedure, allowing the process window for the thermal oxidation procedure to be increased and resulting in improved quality of the thermally grown silicon dioxide layer, is described. After a series of wet clean procedures featuring processes used to remove organic materials and metallic contaminants from the surface of a semiconductor surface, a high temperature anneal procedure is performed in an inert ambient removing additional contaminants not removable via the previous wet clean procedures, while also removing native oxide formed during the previous wet clean procedures. The removal of the additional contaminants and native oxide allow the desired gate insulator thickness be achieved via use of longer thermal oxidation times, thus improving the process window or process control for the thermal oxidation procedure. In addition the removal of contaminants and native oxide via use of the high temperature anneal procedure result in a cleaner semiconductor surface, allowing the desired thickness of the ultra-thin silicon dioxide layers to be obtained using higher oxidation temperatures, thus resulting in higher quality silicon dioxide gate insulator layers when compared to counterpart silicon dioxide layers thermally grown using lower oxidation temperatures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
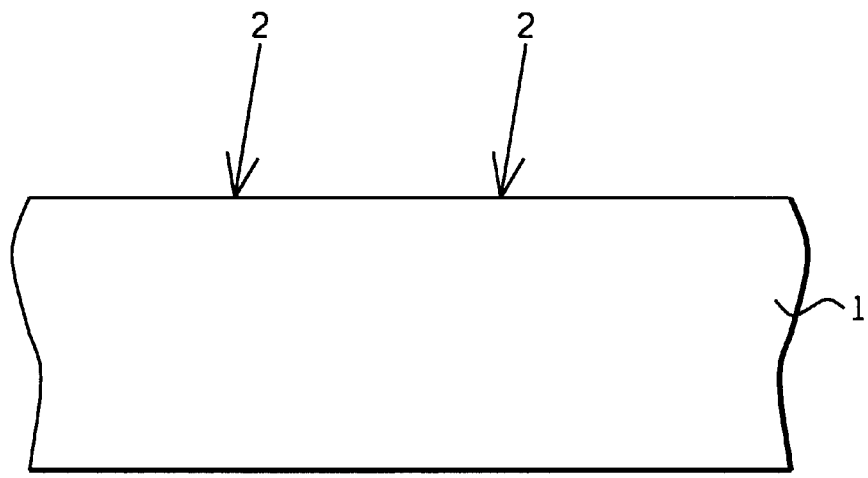
FIGS. 1–2, which schematically, in cross-sectional style, show an ultra-thin silicon dioxide layer, thermally grown after a high temperature anneal performed in an inert ambient.

The method of forming ultra-thin silicon dioxide gate insulator layers, featuring a high temperature anneal procedure performed in an inert ambient prior to a high temperature thermal oxidation procedure, allowing the process window for the thermal oxidation procedure to be increased, and resulting in improved quality of the thermally grown silicon dioxide layer, will now be described in detail. The ultra-thin silicon dioxide layer can be employed as the gate insulator layer for either N channel metal oxide semiconductor (NMOS), or P channel metal oxide semiconductor (PMOS), devices. Semiconductor substrate 1, comprised of P type, single crystalline silicon, with a <100> crystallographic orientation, is used and schematically shown in FIG. 1. Prior to employment of the novel, high temperature anneal procedure, performed in an inert ambient prior to the thermal oxidation procedure, a series of wet clean procedures are performed. First, semiconductor substrate 1, is subjected to a sulfuric acid —hydrogen peroxide ($H_2SO_4$—$H_2O_2$), solution, at a temperature between about 80 to 150° C., for a time between about 0.5 to 10 min, for purposes of removing organic contaminants from the surface of semiconductor substrate 1. Organic contaminants left on the semiconductor substrate during the thermal oxidation procedure would deleteriously influence the quality of the thermally grown silicon dioxide gate insulator layer. After a de-ionized water (DIW), rinse the semiconductor substrate is subjected to a second wet procedure, featuring an ammonium hydroxide —hydrogen peroxide - water, ($NH_4OH$ —$H_2O_2$ —$H_2O$), solution, at a temperature between about 80 to 150° C., for a time between about 0.5 to 10 min, again used to remove organic, as well as inorganic contaminants. After a second DIW rinse the semiconductor substrate is subjected to a third wet procedure in a solution comprised of hydrochloric acid —hydrogen peroxide —water, (HCl —$H_2O_2$ —$H_2O$), at a temperature between about 80 to 150° C., for a time between about 0.5 to 10 min, for purposes of removing metallic impurities located on the surface of semiconductor substrate 1, which if incorporated into the semiconductor substrate during a subsequent oxidation procedure could result in degraded retention time of the subsequent MOSFET device. After a third DIW rinse a drying procedure is performed using an isopropyl alcohol solution.

The objective of the wet clean procedures, described above, is again to remove contaminants that if left remaining would result in poor silicon dioxide quality, or poor silicon retention time. However these procedures do not completely remove organic contaminants but do however result in formation of native oxide on the surface of semiconductor substrate 1. The presence of native oxide, between about 5 to 15 Angstroms, adds to the thickness of the subsequent thermally grown silicon dioxide layer, thus requiring the use of less oxidation time, or the use of lower oxidation temperature, to achieve the desired silicon dioxide thickness, thus resulting in a decreased process window, or decreased silicon dioxide quality. The decreased oxidation time resulting from the presence of the native oxide, deleteriously influences process control, while the lower oxidation temperature limits the quality of the silicon dioxide layer thermally grown at an oxidation temperature lower than desired.

An anneal procedure performed in an inert ambient prior to the thermal oxidation procedure, used to remove contaminants not removed during the previously described wet cleans. as well as to remove native oxide, again employed to improve the process window for the subsequent thermal oxidation procedure as well as employed to improve the quality of the subsequently grown silicon dioxide layer, will now be described. Semiconductor substrate 1, is now subjected to an anneal procedure, performed in an inert ambient such as helium, argon, or xenon, at a temperature between about 500 to 1100° C., for a time between about 0.5 to 30 min. The result of the anneal procedure is the attainment of semiconductor surface 2, schematically shown in FIG. 1. Semiconductor surface 2, is a result of removal of native oxide, which had been formed as a result of the previous wet cleans, and as a result of removal of any organic or inorganic contaminants that may have survived the wet clean procedures. The result of clean, semiconductor surface 2, is the ability to thermally grow silicon dioxide layer 3, at higher temperatures, and via longer oxidation times, however still obtaining the same desired thickness of silicon dioxide as counterpart silicon dioxide layers, which are grown at lower temperatures and shorter oxidation times, however without experiencing the pre-oxidation anneal procedure.

Figure 2:
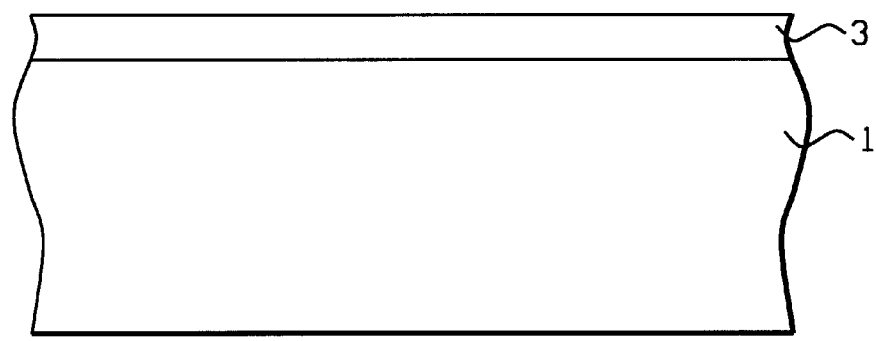

Silicon dioxide layer 3, shown schematically in FIG. 2, at a thickness between about 15 to 20 Angstroms, is thermally grown from semiconductor substrate 1, featuring semiconductor surface 2, which in turn is achieved via the high temperature, inert anneal procedure. The conditions used to grow silicon dioxide gate insulator layer 3, are an oxidation temperature between about 500 to 1000° C., an oxidation time between about 0.1 to 60 min, using an oxygen steam ambient. In contrast silicon dioxide counterparts grown to a thickness between about 15 to 20 Angstroms, without the benefit of the high temperature anneal procedure, would be grown using shorter oxidation times, between about 0.1 to 0.5 min, at lower oxidation temperatures, between about 500 to 700° C., resulting in a decreased process window and decreased silicon dioxide quality when compared to counterparts thermally grown after experiencing the high temperature anneal procedure. It is imperative that the high temperature anneal procedure be performed in an inert ambient. For example if a non-inert ambient such as nitrogen were used, nitridization of the semiconductor surface could result, retarding subsequent silicon dioxide growth.

Figure 3:
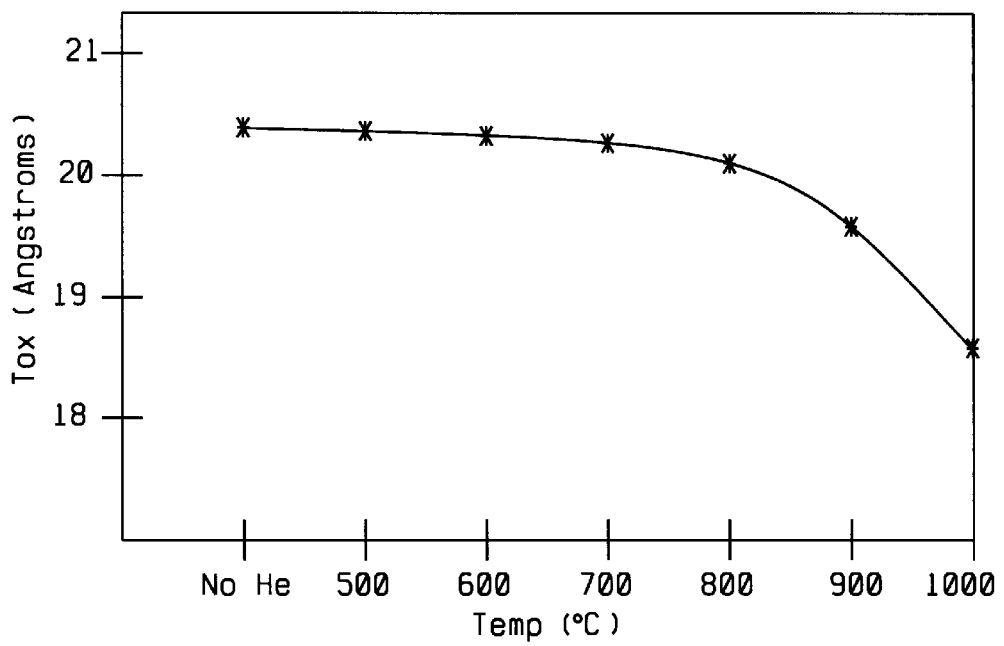
FIG. 3, which graphically illustrates the increased process window for a thermal oxidation procedure, as evidenced by the decrease in silicon dioxide thickness as a result of increasing preoxidation anneal temperature, for a specific oxidation time and temperature.

The importance of the high temperature anneal procedure is graphically illustrated in FIG. 3. The thickness of a silicon dioxide gate layer is shown as a function of the temperature of the anneal procedure performed in an inert ambient, prior to the thermal oxidation procedure. It can be seen that for a specific oxidation temperature, and for a specific oxidation time, the higher the anneal temperature the thinner the thickness of the subsequent thermally grown silicon dioxide layer. This is a result of efficiently removing contaminants and native oxide from the semiconductor surface, prior to the thermal oxidation procedure. The presence of the native oxide and contaminants would require less oxidation time or a lower oxidation temperature to result in the same thickness of silicon dioxide which had been grown from a surface subjected to the anneal procedure. The longer oxidation times, and higher oxidation temperatures, allowed via use of the pre-oxidation anneal procedure, result in improved insulator quality as well as an increased process window.

While this invention has been particularly shown and described with reference to the preferred embodiments thereof, it will be understood by those skilled in the art that various changes in form and details may be made without departing from the spirit or scope of the invention.

What is claimed is:

1. A method of forming a gate insulator layer on a semiconductor substrate, comprising the steps of:

providing said semiconductor substrate;

performing a series of wet clean procedures comprised of a first, and of a second wet clean procedure, for removal of organic material from surface of said semiconductor substrate, and a third wet clean procedure for removal of inorganic material from surface of said semiconductor substrate, with said series of wet clean procedures resulting in formation of a native oxide on surface of said semiconductor substrate;

performing an anneal procedure in an inert ambient to remove said native oxide from the surface of said semiconductor substrate; and thermally growing said gate insulator layer on said semiconductor substrate.

2. The method of claim 1, wherein said first wet clean procedure is performed in a solution of sulfuric acid —hydrogen peroxide, at a temperature between about 80 to 150° C., for a time between about 0.5 to 10 min.

3. The method of claim 1, wherein said second wet clean performed in a solution of ammonium hydroxide— hydrogen peroxide—water, at a temperature between about 80 to 150° C., for a time between about 0.5 to 10 min.

4. The method of claim 1, wherein said third wet clean procedure is performed in a solution of hydrochloric acid—hydrogen peroxide—water, at a temperature between about 80 to 150° C., for a time between about 0.5 to 10 min.

5. The method of claim 1, wherein said anneal procedure is performed in an ambient comprised of inert gases such as helium, argon, or xenon.

6. The method of claim 1, wherein said anneal procedure is performed at a temperature between about 500 to 1100° C.

7. The method of claim 1, wherein said anneal procedure is performed for a time between about 0.1 to 30 min.

8. The method of claim 1, wherein said gate insulator layer is a silicon dioxide insulator layer, thermally grown in an oxygen—steam ambient.

9. The method of claim 1, wherein said gate insulator layer is thermally grown to a thickness between about 15 to 20 Angstroms.

10. The method of claim 1, wherein said gate insulator layer is thermally grown at a temperature between about 500 to 1100° C.

11. The method of claim 1, wherein said gate insulator layer is thermally grown for a time between about 0.1 to 60 min.

12. A method of preparing a semiconductor substrate surface for growth of an ultra-thin silicon dioxide gate insulator layer via a series of wet clean procedures used to remove organic and inorganic material from surface of said semiconductor substrate, and via a high temperature anneal procedure performed in a helium ambient, prior to a thermal oxidation procedure used to remove native oxide formed on surface of said semiconductor substrate during said series of said wet clean procedures, comprising the steps of:

providing said semiconductor substrate;

performing a first wet clean procedure in a solution comprised of sulfuric acid—hydrogen peroxide;

performing a second wet clean procedure in a solution comprised of ammonium hydroxide—hydrogen peroxide—water;

performing a third wet clean procedure in a solution comprised of hydrochloric acid—hydrogen peroxide—water, with said native oxide formed on surface of said semiconductor substrate during said first wet clean procedure, during said second wet clean procedure, and during said third wet clean procedure;

performing a drying procedure using isopropyl alcohol;

performing said high temperature anneal procedure in said helium ambient removing said native oxide from surface of said semiconductor substrate; and thermally growing said ultra-thin silicon dioxide gate insulator on said surface of said semiconductor substrate.

13. The method of claim 12, wherein said first wet clean procedure is performed in said solution of sulfuric acid—hydrogen peroxide, at a temperature between about 80 to 150° C., for a time between about 0.5 to 10 min.

14. The method of claim 12, wherein a second wet clean procedure is performed in said solution of ammonium hydroxide—hydrogen peroxide—water, at a temperature between about 80 to 150° C., for a time between about 0.5 to 10 min.

15. The method of claim 12, wherein a third wet clean procedure is performed in said solution of hydrochloric acid—hydrogen peroxide—water, at a temperature between about 80 to 150° C., for a time between about 0.5 to 10 min.

16. The method of claim 12, wherein said high temperature anneal procedure is performed in said helium ambient, at a temperature between about 500 to 1100° to C.

17. The method of claim 12, wherein said high temperature anneal procedure, performed in said helium ambient, is performed for a time between about 0.1 to 30 min.

18. The method of claim 12, wherein said ultra-thin silicon dioxide gate insulator layer is thermally grown in an oxygen—steam ambient, at a temperature between about 500 to 1100° C.

19. The method of claim 12, wherein said ultra-thin silicon dioxide gate insulator layer is thermally grown for a time between about 0.1 to 60 min.

20. The method of claim 12, wherein said ultra-thin silicon dioxide gate insulator layer is thermally grown to a thickness between about 15 to 20 Angstroms.

* * * * *